US010418267B2

(12) United States Patent
Oka et al.

(10) Patent No.: US 10,418,267 B2
(45) Date of Patent: Sep. 17, 2019

(54) METHOD OF PROCESSING A SEMICONDUCTOR WAFER, SEMICONDUCTOR CHIP, AND SURFACE PROTECTIVE TAPE

(71) Applicant: FURUKAWA ELECTRIC CO., LTD., Tokyo (JP)

(72) Inventors: Yoshifumi Oka, Tokyo (JP); Masami Aoyama, Tokyo (JP)

(73) Assignee: FURUKAWA ELECTRIC CO., LTD., Tokyo (JP)

(*) Notice: Subject to any disclaimer, the term of this patent is extended or adjusted under 35 U.S.C. 154(b) by 0 days.

(21) Appl. No.: 15/702,021

(22) Filed: Sep. 12, 2017

(65) Prior Publication Data

US 2018/0012787 A1   Jan. 11, 2018

Related U.S. Application Data

(63) Continuation of application No. PCT/JP2016/057615, filed on Mar. 10, 2016.

(30) Foreign Application Priority Data

Mar. 13, 2015 (JP) ................................. 2015-051482

(51) Int. Cl.
*H01L 21/302* (2006.01)
*H01L 21/3065* (2006.01)
(Continued)

(52) U.S. Cl.
CPC ........ *H01L 21/6836* (2013.01); *H01L 21/302* (2013.01); *H01L 21/3065* (2013.01); *H01L 21/78* (2013.01); *H01L 24/27* (2013.01)

(58) Field of Classification Search
CPC ..... H01L 21/30; H01L 21/78; H01L 21/6836; H01L 21/302; H01L 21/3065
(Continued)

(56) References Cited

U.S. PATENT DOCUMENTS

| 9,355,907 B1* | 5/2016 | Lei ........................ B23K 26/364 |
| 2002/0037631 A1* | 3/2002 | Mimata ............... H01L 21/6835 438/460 |

(Continued)

FOREIGN PATENT DOCUMENTS

| JP | H 05-198542 A | 8/1993 |
| JP | H 08-20756 A | 1/1996 |

(Continued)

OTHER PUBLICATIONS

English Translation of JP2010165963.*
(Continued)

*Primary Examiner* — Sheikh Maruf
(74) *Attorney, Agent, or Firm* — Birch, Stewart, Kolasch & Birch, LLP (57) ABSTRACT

A method of processing a semiconductor wafer, in which a mask is formed: by cutting, with $CO_2$ laser, a portion corresponding to a street, out of a temporary-adhesive of a surface protective tape to protect on a patterned face; carrying out dicing with $SF_6$ plasma; and carrying out ashing, by removing a layer of the temporary-adhesive, with $O_2$ plasma; a semiconductor chip; and a surface protective tape.

9 Claims, 8 Drawing Sheets

(51) Int. Cl.
  *H01L 21/78* (2006.01)
  *H01L 23/00* (2006.01)
  *H01L 21/683* (2006.01)

(58) Field of Classification Search
  USPC .......................................... 438/459–462, 959
  See application file for complete search history.

(56) References Cited

U.S. PATENT DOCUMENTS

| | | | | |
|---|---|---|---|---|
| 2003/0176069 | A1* | 9/2003 | Yuasa | H01J 37/32192 438/692 |
| 2004/0102025 | A1* | 5/2004 | Arita | H01J 37/32082 438/460 |
| 2006/0024924 | A1* | 2/2006 | Haji | H01L 21/6835 438/464 |
| 2006/0234512 | A1* | 10/2006 | Yuasa | H01J 37/32192 438/710 |
| 2006/0281226 | A1* | 12/2006 | Nakamura | B28D 5/0011 438/113 |
| 2009/0209087 | A1 | 8/2009 | Arita | |
| 2010/0022071 | A1* | 1/2010 | Arita | H01L 21/3043 438/463 |
| 2010/0081257 | A1* | 4/2010 | Hendricks | H01L 21/78 438/462 |
| 2010/0173474 | A1* | 7/2010 | Arita | H01L 21/78 438/462 |
| 2011/0312157 | A1* | 12/2011 | Lei | H01L 21/78 438/462 |
| 2012/0322234 | A1 | 12/2012 | Yalamanchili et al. | |
| 2014/0295644 | A1* | 10/2014 | Harikai | H01L 21/78 438/464 |
| 2015/0104929 | A1* | 4/2015 | Lei | H01L 21/78 438/462 |
| 2016/0027697 | A1* | 1/2016 | Lei | H01L 21/0337 438/463 |
| 2016/0042996 | A1* | 2/2016 | Yakoo | H01L 21/78 438/462 |
| 2016/0293456 | A1* | 10/2016 | Okita | H01L 21/78 |
| 2017/0076970 | A1* | 3/2017 | Stranzl | H01L 21/3081 |
| 2017/0278801 | A1* | 9/2017 | Park | H01L 21/78 |
| 2017/0345715 | A1* | 11/2017 | Harikai | H01L 21/3065 |

FOREIGN PATENT DOCUMENTS

| | | | | |
|---|---|---|---|---|
| JP | 2002-151440 | A | | 5/2002 |
| JP | 2003-179005 | A | | 6/2003 |
| JP | 2007-019385 | A | | 1/2007 |
| JP | 2007-19386 | A | | 1/2007 |
| JP | 2008-193034 | A | | 8/2008 |
| JP | 2009-033087 | A | | 2/2009 |
| JP | 2009033087 | A | * | 2/2009 ............ H01L 24/27 |
| JP | 2010-165963 | A | | 7/2010 |
| JP | 2010165963 | A | * | 7/2010 |
| JP | 2014-523110 | A | | 9/2014 |

OTHER PUBLICATIONS

English Translation of JP2009033087.*
International Search Report (PCT/ISA/210) issued in PCT/JP2016/057615, dated May 17, 2016.
Written Opinion (PCT/ISA/237) issued in PCT/JP2016/057615, dated May 17, 2016.
Japanese Office Action dated Feb. 5, 2019, for corresponding Japanese Application No. 2015-051482, with English translation.
Japanese Office Action dated Jul. 22, 2019, with English translation. for corresponding Japanese Application No. 2015-051482, with English translation.

* cited by examiner

METHOD OF PROCESSING A SEMICONDUCTOR WAFER, SEMICONDUCTOR CHIP, AND SURFACE PROTECTIVE TAPE

CROSS-REFERENCE TO RELATED APPLICATIONS

This application is a Continuation of PCT International Application No. PCT/JP2016/057615 filed on Mar. 10, 2016, which claims priority under 35 U.S.C. § 119 (a) to Japanese Patent Application No. 2015-051482 filed in Japan on Mar. 13, 2015. Each of the above applications is hereby expressly incorporated by reference, in its entirety, into the present application.

TECHNICAL FIELD

The present invention relates to a processing method of: singulating a semiconductor wafer into chips, and in particular, it relates to a semiconductor-wafer processing method using plasma dicing; a surface protective tape that can be used in the plasma dicing; and semiconductor chips obtained by the processing method.

BACKGROUND ART

In recent years, remarkable evolution has made on the thinning of the semiconductor chip and the downsizing of the chip. In particular, the thinning is required in the IC cards with built-in semiconductor IC chips, such as a memory card and a smart card. Further, the downsizing of the chip is required in LED or LCD driving devices and the like. With the increase in these demands from now, the needs for the thinning of the semiconductor chip and the downsizing of the chip are thought of as being increased much more.

These semiconductor chips are obtained, by thinning a semiconductor wafer to a predetermined thickness in the backing-face grinding step or an etching step, and then dividing the semiconductor wafer into individual chips through a dicing step. In this dicing step, a blade dicing method of cutting the semiconductor wafer with a dicing blade is used up to now. In this blade dicing method, the cutting resistance by the blade is put directly on the semiconductor wafer at the time of cutting, so that a microscopic crack (or chipping) sometimes occurs in the semiconductor chip by this cutting resistance. Occurrence of the chipping does not only deteriorate outer appearance of the semiconductor chip, but also in some cases, there is a risk that even a circuit pattern on the chip is damaged, for example, a damage of chips is occurred due to lack (or insufficiency) of the transverse strength (or deflective strength) at the time of picking up. Further, in the foregoing physical dicing step using such a blade, it is impossible to set the width of a kerf (also referred to as a scribe line or a street) which is an interval between chips to less than the thick blade width, so that it is difficult to increase a yield of the chip gotten from a sheet of wafer. Further, a long time period to be taken for the processing of the wafer is also a problem.

In the dicing step, use is also made of any of various kinds of methods, other than the blade cut method. There is a DBG (i.e. dicing before grinding) method of, in view of the difficulty in carrying out the dicing after the thinning of the wafer, forming in first a groove with a predetermined thickness in the wafer, and then carrying out a grinding step, and thereby for achieving both the thinning and the singulation into chips at the same time. This method has the advantage that although the kerf width is similar to that in the blade dicing method, the transverse strength of the chip is increased, so that a damage of the chip can be suppressed.

Further, there is a laser dicing method of carrying out a dicing step with a laser. The laser dicing method has the advantage that a kerf width can be narrowed and the laser dicing method is a dry process. However, there is a disadvantage that a wafer surface is contaminated with a sublimate at the time of cutting with a laser. For this reason, the wafer surface is sometimes subjected to a pretreatment of protecting it with a predetermined liquid protecting material. Further, even when the method is called a dry process, the method cannot be completed by a dry process. Further, in the case of laser, although a more rapid process than the blade is possible, the process remains unchanged in carrying out a processing along every one line, and therefore it takes a certain time period for producing an extremely small chip.

In a case of using a wet process, such as a water-jet method of carrying out a dicing step with a water pressure, there is a possibility that a problem occurs in the area which is sensitive to a surface contamination, such as an MEMS device, a CMOS sensor, and the like. There is also a disadvantage that a kerf width cannot be narrowed, so that a chip yield is not increased.

The stealth dicing method of forming a modifying layer with a laser in the thickness direction of the wafer, and then splitting the modifying layer by expansion to singulate the wafer, has the advantage that a kerf width can be reduced to zero and a processing can be carried out in a dry state. However, a transverse strength of the chip is not increased higher than expectation from the thermal history at the time of forming the modifying layer. Further, silicon debris sometimes occurs at the time of splitting the modifying layer by expansion. Further, adjacent chips are apt to collide with each other, so that there is a risk that the chip falls short (or insufficiency) of the transverse strength.

Further, as a combined method of the stealth dicing and the dicing before grinding, there is a chip-singulation method corresponding to a narrow scribe width, which forms in first a modifying layer with only a predetermined width prior to the thinning, and then carrying out a grinding step from the backing-face side, thereby for achieving the thinning and the singulation into chips at the same time. This technique improves disadvantages of the process, and has the advantage that a kerf width is zero and a chip yield is high and also a transverse strength is increased, because a silicon modifying layer is cleaved and singulated by a stress in the wafer backing-face side grinding step. However, because singulation is performed in the backing-face side grinding step, a phenomenon is sometimes seen, in which an end side of the chip collides with an adjacent chip, and thereby that the chip corner is dropped out.

Further, there is a plasma dicing method (for example, see Patent Literature 1). The plasma dicing is a method of dividing a semiconductor wafer, by selectively etching a portion which is not covered with a mask, using plasma. If this dicing method is used, segmentation of chips can be achieved selectively, and even if the scribe line is curved, the segmentation is possible with no trouble. Further, as the etching speed is very high, in recent years, this dicing method is considered one of the most suitable processes for the segmentation into chips.

CITATION LIST

Patent Literature

Patent Literature 1: JP-A-2007-19385 ("JP-A" means unexamined published Japanese patent application)

SUMMARY OF INVENTION

Technical Problem

In the plasma dicing method, use is made of, as a plasma generating gas, a fluorine-based gas which has a very high reactivity with a wafer, such as sulfur hexafluoride ($SF_6$) and carbon tetrafluoride ($CF_4$). Because of its high-etching rate (speed), a mask protection with respect to the surface not to be etched is necessary. For this reason, a mask formation by a resist or a tape in advance becomes necessary.

In order to form the mask, as described in Patent Literature 1, generally the technique consists of: coating a resist on the backing-face side of the wafer; and then removing the portion corresponding to a street by a photolithography, to form the mask. Therefore, in order to carry out the plasma dicing, it is required for a facility for the photolithographic step other than the plasma dicing facility, and for this reason, there is a problem of increase in chip costs. Further, because of being in a state that a resist film is remaining after the plasma-etching, a large amount of a solvent is utilized to remove the resist, and in the case where the resist is not able to be removed completely, there is a risk that the remained resist act as an adhesive deposit, which results in occurrence of a defective chip. Further, there is also a disadvantage that an overall processing process gets longer period, because of undergoing a masking step with a resist.

In view of the above problems, the present invention is made and is contemplated for providing a novel method of processing the semiconductor wafer, which suppresses occurrence of the chipping in the plasma dicing processing of the semiconductor wafer, and which also resolves the conventional inexpedience in the case of carrying out the plasma dicing.

Further, the present invention is contemplated for providing a semiconductor chip obtained by the method of processing the semiconductor wafer; and for providing a surface protective tape necessary to carry out the method of processing the semiconductor wafer.

Solution to Problem

The problems of the present invention are solved by the following means.

[1] A method of processing a semiconductor wafer, comprising the steps (a) to (d):

(a) a step of grinding the backing-face side of a semiconductor wafer at a state that a surface protective tape having a temporary-adhesive layer on a substrate film is laminated on a patterned-face side of the semiconductor wafer; and then laminating a wafer-fixing tape on the ground backing-face side, followed by supporting and fixing to a ring flame;

(b) a step of forming an opening at a street from the patterned-face side of the semiconductor wafer, through a step of, comprising: $CO_2$ laser cutting of a portion corresponding to the street of the semiconductor wafer; and peeling-off of the substrate film;

(c) a plasma-dicing step of segmentalizing the semiconductor wafer at the street with $SF_6$ plasma, and thereby for singulating the semiconductor wafer into semiconductor chips; and (d) an ashing step of removing the temporary-adhesive layer with $O_2$ plasma.

[2] The method of processing the semiconductor wafer described in the item [1], wherein the step (b) comprises:

(i) a step of exposing the temporary-adhesive layer by peeling-off the substrate film from the surface protective tape laminated on the patterned face of the semiconductor wafer; and (ii) a step of forming an opening at the street of the semiconductor wafer by $CO_2$ laser cutting of the portion corresponding to the street of the semiconductor wafer out of said exposed temporary-adhesive layer.

[3] The method of processing the semiconductor wafer described in the item [1], wherein the step (b) comprises:

(iii) a step of forming an opening at the street of the semiconductor wafer by $CO_2$ laser cutting of the portion corresponding to the street of the semiconductor wafer out of the surface protective tape laminated on the patterned face of the semiconductor wafer; and (iv) a step of exposing the temporary-adhesive layer by peeling-off the substrate film from said surface protective tape.

[4] The method of processing the semiconductor wafer described in any one of the items [1] to [3], further comprising:

a step of curing the temporary-adhesive layer by irradiating an ultraviolet light prior to peeling-off the substrate film.

[5] The method of processing the semiconductor wafer described in any one of the items [1] to [4], wherein the wafer-fixing tape in the step (a) is a dicing tape or a dicing die-bonding tape.

[6] The method of processing the semiconductor wafer described in any one of the items [1] to [5], further comprising:

a step of picking up the chips from the wafer-fixing tape, after the step (d).

[7] The method of processing the semiconductor wafer described in the item [6], further comprising:

a step of transiting the thus-obtained picked-up chips to a die-bonding step.

[8] A semiconductor chip produced by the method of processing the semiconductor wafer described in any one of the items [1] to [7].

[9] A surface protective tape which is utilized in the method of processing the semiconductor wafer described in any one of the items [1] to [7].

Advantageous Effects of Invention

According to the present invention, it is able to achieve: reduction in chipping of the chip-cutting plane. Further, according to the present invention, it is able to achieve: simplification of the fabrication facility, and thereby suppress the process costs.

Other and further features and advantages of the invention will appear more fully from the following description, appropriately referring to the accompanying drawings.

BRIEF DESCRIPTION OF DRAWINGS

FIGS. 1(a) to (c) are schematic cross-sectional views illustrating steps until a surface protective tape is laminated onto a semiconductor wafer in a first embodiment of the present invention. Fragmentary FIG. 1(a) shows a semiconductor wafer. Fragmentary FIG. 1(b) shows how the surface protective tape is laminated. Fragmentary

FIGS. 2(a) to 2(c) are schematic cross-sectional views illustrating steps of thinning to fixing of semiconductor wafer in the first embodiment of the present invention. Fragmentary

FIGS. 3(a) to 3(c) are schematic cross-sectional views illustrating steps until the mask formation in the first embodiment of the present invention. Fragmentary

FIGS. 4(a) to 4(c) are schematic cross-sectional views illustrating the plasma dicing and plasma ashing steps in the first embodiment of the present invention. Fragmentary

FIGS. 5(a) and 5(b) are schematic cross-sectional views illustrating steps until chips are picked up in the first embodiment of the present invention. Fragmentary FIG. 5(b) shows how the chip is picked up.

FIGS. 6(a) to 6(c) are schematic cross-sectional views illustrating a state before and after a treatment with an ultraviolet irradiation carrying out in the second embodiment of the present invention. Fragmentary

FIGS. 7(a) to 7(c) are schematic cross-sectional views illustrating a state before and after carrying out the mask formation with a laser in a third embodiment of the present invention. Fragmentary

FIGS. 8(a) to 8(d) are schematic cross-sectional views illustrating steps until peeling-off the substrate film in a forth embodiment of the present invention. Fragmentary

MODE FOR CARRYING OUT THE INVENTION

As explained below, in the method of processing the semiconductor wafer of the present invention, any photo-lithographic step becomes unnecessary, and therefore production costs can be suppressed, by the steps of: forming a mask through cutting with $CO_2$ laser of the portion corresponding to the street, out of the surface protective tape for protecting the patterned face or the temporary-adhesive of the surface protective tape; and carrying out $SF_6$ plasma dicing, by using the mask.

The method of processing the semiconductor wafer of the present invention includes, at least, the steps (a) to (d):

(a) a step of grinding the backing-face side of a semiconductor wafer at a state that a surface protective tape having a temporary-adhesive layer on a substrate film is laminated on a patterned-face side of the semiconductor wafer; and then laminating a wafer-fixing tape on the ground backing-face side, followed by supporting and fixing to a ring flame;

(b) a step of forming an opening at a street from the patterned-face side of the semiconductor wafer, through a step of, comprising: $CO_2$ laser cutting of a portion corresponding to the street of the semiconductor wafer; and peeling-off of the substrate film;

(c) a plasma-dicing step of segmentalizing the semiconductor wafer at the street with $SF_6$ plasma, and thereby for singulating the semiconductor wafer into semiconductor chips; and (d) an ashing step of removing the temporary-adhesive layer with $O_2$ plasma.

In the present invention, the following steps, after the step (d), are preferably comprised of:

(e) a step of picking up chips from the wafer-fixing tape; and (f) a step of transiting the picked-up chips to a die-bonding step.

Herein, in the step (b), the step of peeling-off the substrate film from the surface protective tape is carried out before or after the step of cutting with $CO_2$ laser.

Specifically, the following steps are preferable.

A First and Preferable Step of the Step (b)

In a first and preferable step, a step of peeling-off the substrate film from the surface protective tape, is carried out before the step of cutting with $CO_2$ laser. Specifically, the first and preferable step is comprised of the following steps (i) and (ii):

(i) a step of exposing the temporary-adhesive layer by peeling-off the substrate film from the surface protective tape laminated on the patterned face of the semiconductor wafer; and (ii) a step of forming an opening at the street of the semiconductor wafer by $CO_2$ laser-cutting of the portion corresponding to the street of the semiconductor wafer out of said exposed temporary-adhesive layer.

A Second and Preferable Step of the Step (b)

In a second and preferable step, a step of peeling-off the substrate film from the surface protective tape, is carried out after the step of cutting with $CO_2$ laser. Specifically, the second and preferable step is comprised of the following steps (iii) and (iv):

(iii) a step of forming an opening at the street of the semiconductor wafer by $CO_2$ laser-cutting of the portion corresponding to the street of the semiconductor wafer out of the surface protective tape laminated on the patterned face of the semiconductor wafer; and (iv) a step of exposing the temporary-adhesive layer by peeling-off the substrate film from the surface protective tape.

Further, it is also preferable that the step (b) further comprises: a step of curing the temporary-adhesive layer by irradiating an ultraviolet light, before peeling-off the substrate film.

Herein, by the plasma treatment with the $SF_6$ plasma in the step (c), an opening is formed, at the portion corresponding to the street from the patterned face-side of the semiconductor wafer, and chips are singulated by the plasma treatment with respect to said opening portion from the temporary-adhesive layer side.

Hereinafter, preferable embodiments of the processing method of the semiconductor wafer according to the present invention are described with reference to drawings. However, the present invention is not limited to these embodiments.

The method of processing the semiconductor wafer of the present invention is classified into first to forth embodiments, as described below.

Note that, as for the apparatus and materials, each of which can be used in the steps described below, use can be made of an apparatus and the like which is used for processing of the semiconductor wafer from the past, unless otherwise specified, and as for the use conditions thereof, suitable conditions in an ordinary manner can be set. Further, omitted are duplicated descriptions about the materials, structures, methods, effects, and the like, which are common to each embodiment.

<First Embodiment [FIGS. 1(a) to 5(b)]>

A singulation method of the semiconductor wafer which is a preferable first embodiment of the present invention is described with reference to FIG. 1(a) to FIG. 5(b).

Figure 1A:
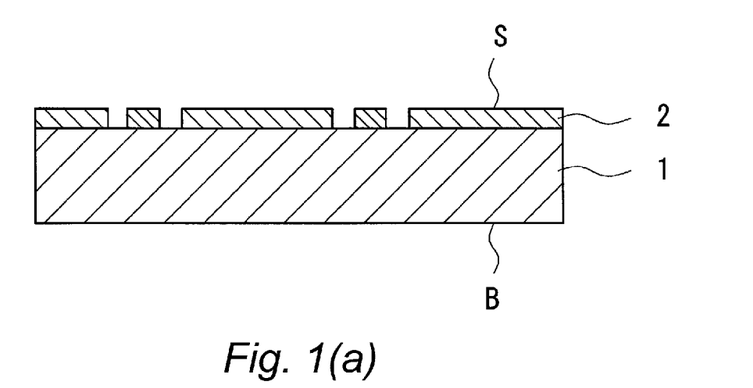
Figure 1B:
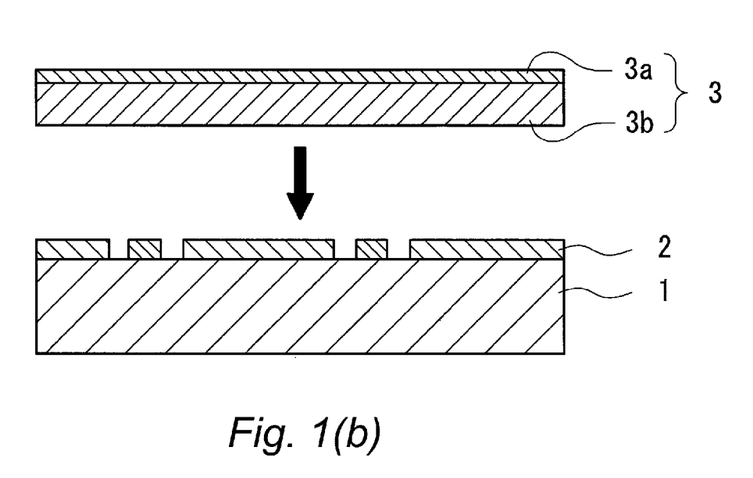
Figure 1C:
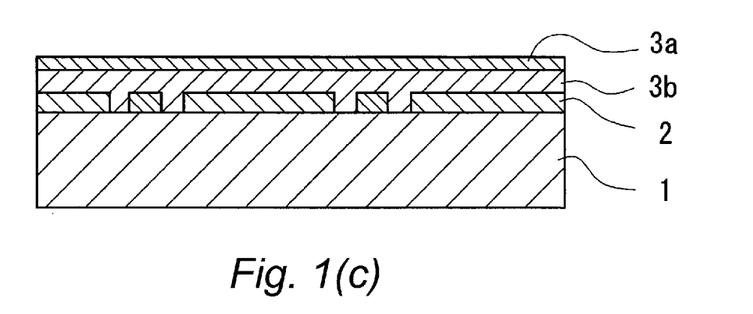
FIG. 1(c) shows a semiconductor wafer on which the surface protective tape is laminated.

A semiconductor wafer 1 has a patterned face 2 on the surface S of which a circuit or the like of the semiconductor device is formed (see FIG. 1(a)). On this patterned face 2, a surface protective tape 3 having a temporary-adhesive layer 3b provided on a substrate film 3a is laminated (see FIG. 1(b)), thereby to obtain the semiconductor wafer 1 whose patterned face 2 is covered with the surface protective tape 3 (see FIG. 1(c)).

Figures 2A, 2B, 2C:
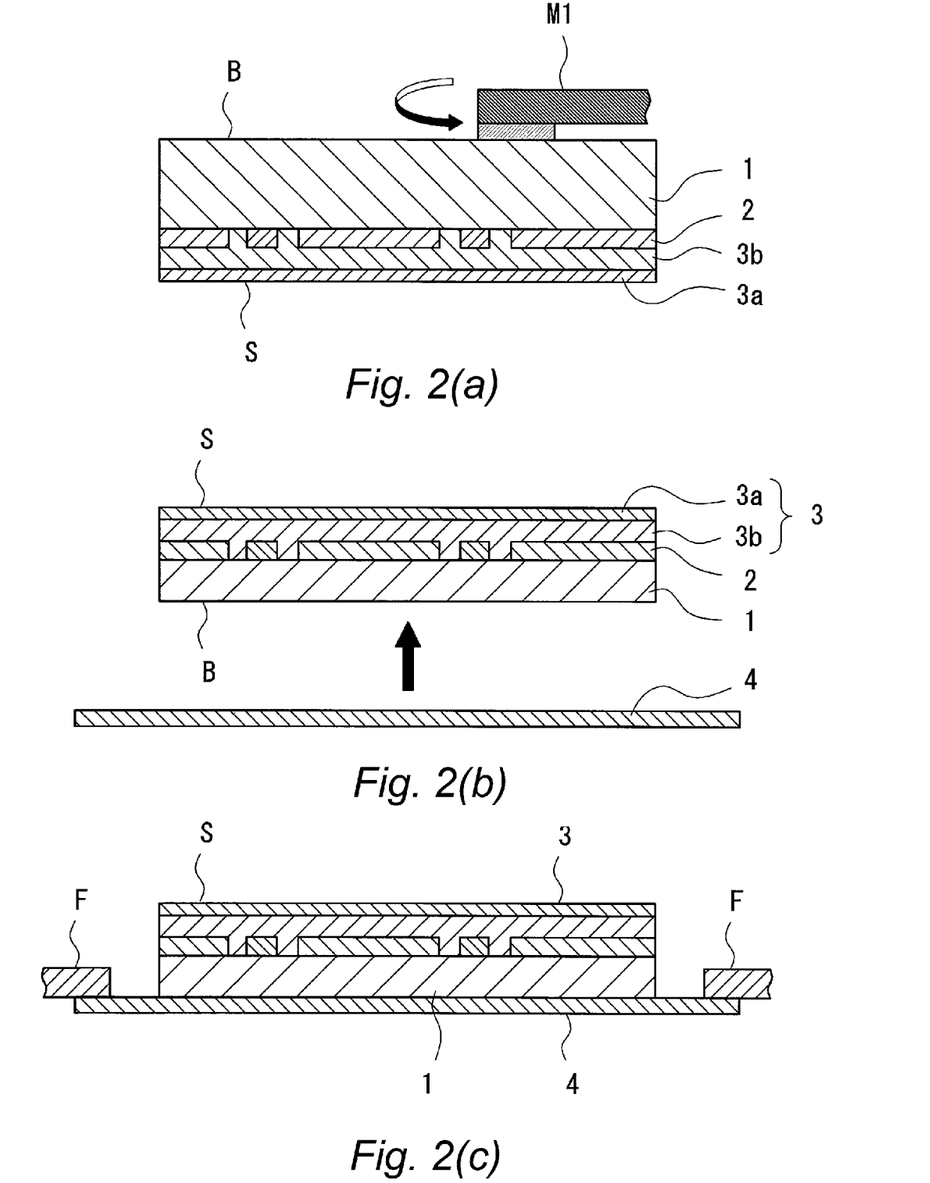
FIG. 2(a) shows thinning processing of the semiconductor wafer. Fragmentary
FIG. 2(b) shows how a wafer-fixing tape is laminated. Fragmentary
FIG. 2(c) shows a state in which the semiconductor wafer is fixed to a ring flame.

Then, the backing face B of the semiconductor wafer 1 is ground by a wafer-grinding apparatus M1, to thin a thickness of the semiconductor wafer 1 (see FIG. 2(a)). On the ground backing-face B, a wafer-fixing tape 4 is laminated (see FIG. 2(b)), which is supported and fixed to a ring flame F (see FIG. 2(c)).

Figure 3A:
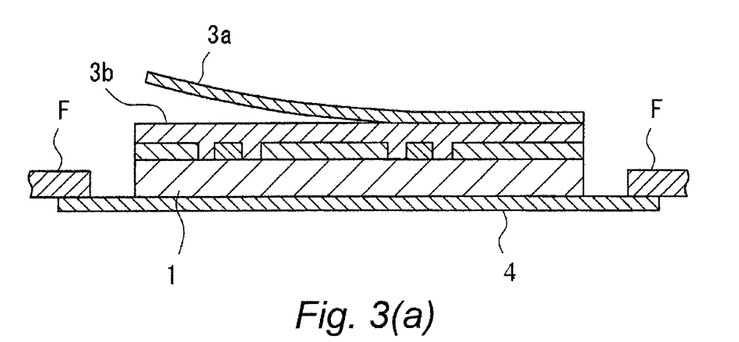
FIG. 3(a) shows how the substrate film is peeled off from the surface protective tape. Fragmentary
Figure 3B:
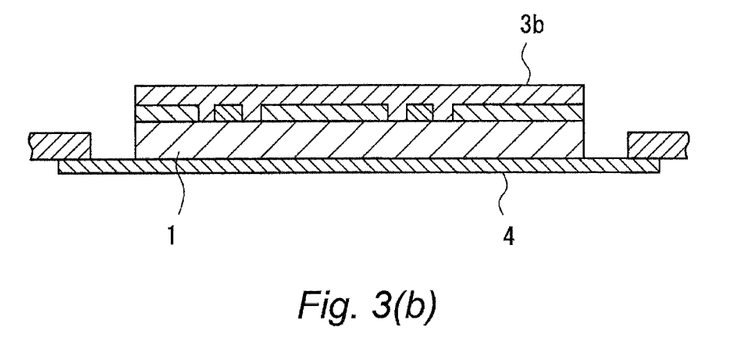
FIG. 3(b) shows a state in which the temporary-adhesive layer of the surface protective tape is exposed (uncovered). Fragmentary
Figure 3C:
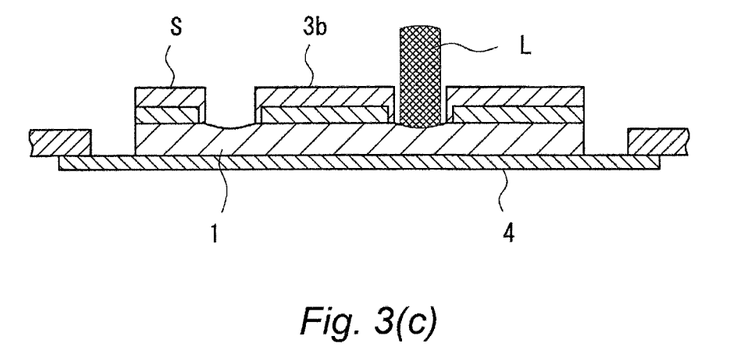
FIG. 3(c) shows a step of cutting off the temporary-adhesive layer corresponding to the street with a laser.

The substrate film 3a of the surface protective tape 3 is peeled off from the semiconductor wafer 1, while leaving the temporary-adhesive layer 3b on the semiconductor wafer 1 (see FIG. 3(a)), so that the temporary-adhesive layer 3b is exposed (uncovered) (see FIG. 3(b)). Further, $CO_2$ laser L is irradiated from the surface S side toward a plurality of streets (not shown) appropriately formed in a grid pattern or the like onto the patterned face 2, thereby to remove the temporary-adhesive layer 3b, so that an opening is formed (see FIG. 3(c)).

Figure 4A:
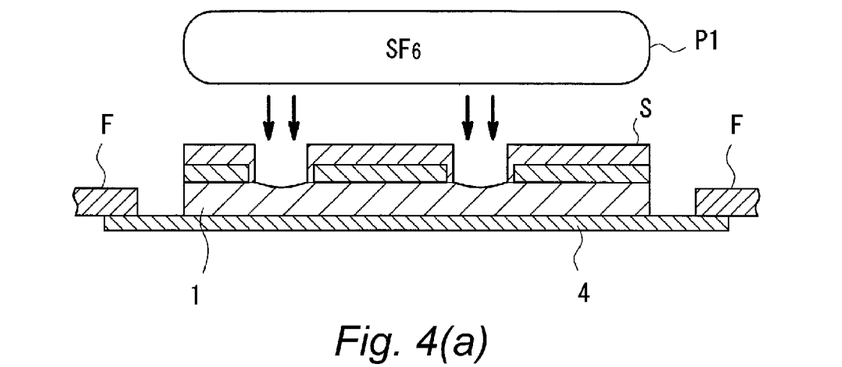
FIG. 4(a) shows how the plasma dicing is carried out. Fragmentary
Figure 4B:
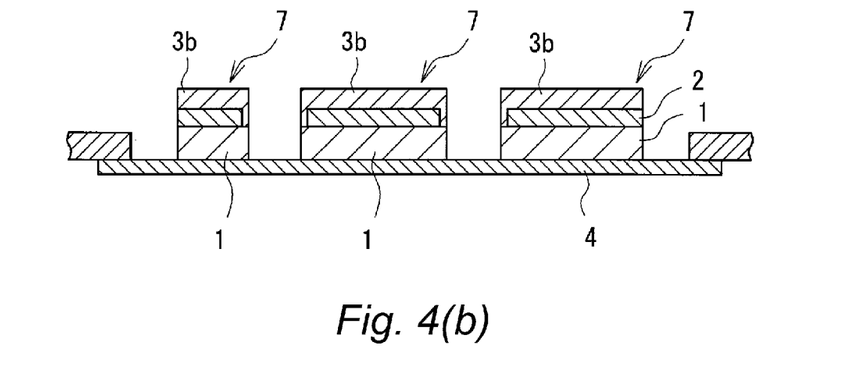
FIG. 4(b) shows a state in which the semiconductor wafer is singulated into chips. Fragmentary
Figure 4C:
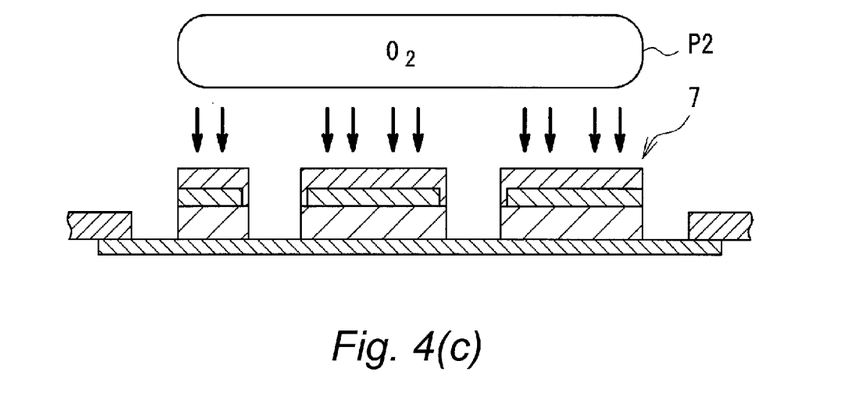
FIG. 4(c) shows how the plasma ashing is carried out.

Then, a treatment with the plasma P1 of $SF_6$ gas is carried out from the surface S side, thereby to etch the semiconductor wafer 1 which is exposed at the street portion (see FIG. 4(a)), and the semiconductor wafer is divided into individual chips 7, which results in singulation (see FIG. 4(b)). After that, ashing with the plasma P2 of $O_2$ gas is carried out (see FIG. 4(c)), thereby to remove the temporary-adhesive layer 3b remaining on the surface S (see FIG. 5(a)).

Figure 5A:
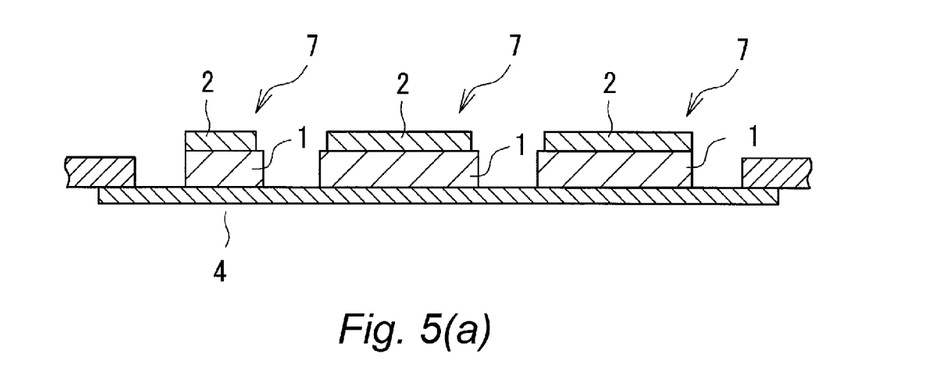
FIG. 5(a) shows a state, in which the temporary-adhesive layer, acting as a mask, is removed. Fragmentary
Figure 5B:
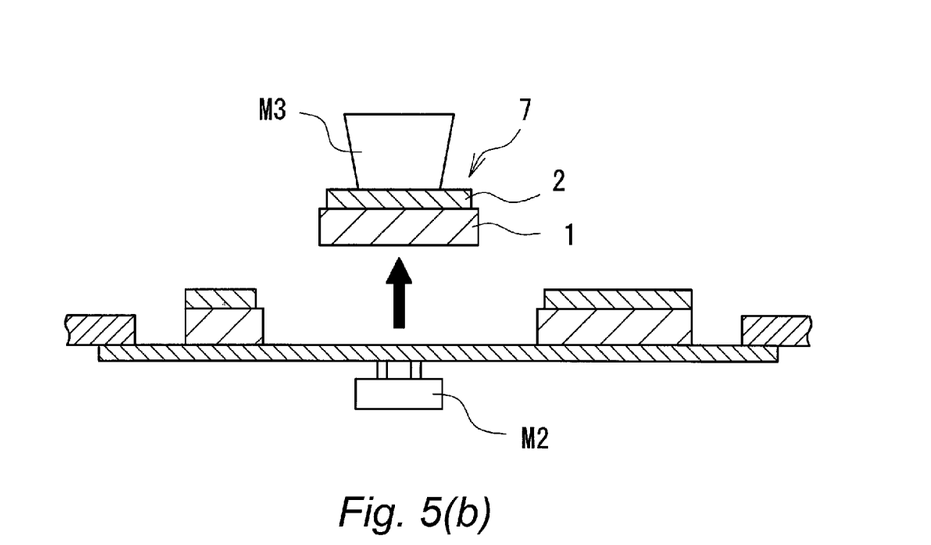

Then, at last, the singulated chip 7 is knocked up by a pin M2, and is picked up by adsorption with a collet M3 (see FIG. 5(b)).

Herein, a process of etching of Si of the semiconductor wafer with the use of $SF_6$ gas is also called as a BOSCH process. This process allows a reaction of the exposed Si and a fluorine atom formed from a plasmarized $SF_6$, thereby to remove the exposed Si as silicon tetrafluoride ($SiF_4$), which is also called as reactive ion etching (RIE). On the other hand, the removal with the $O_2$ plasma is a method which is also used as plasma cleaner in the course of a semiconductor production process, and is also called as ashing (ash-making), which is one of means for removal of the organic substance. This method is carried out, in order to clean an organic substance residue remaining on a semiconductor device surface.

Then, materials that can be used in the above method are described.

The semiconductor wafer 1 is a silicon wafer, on its one side, having the patterned face 2 on which the circuit or the like of the semiconductor device is formed. The patterned face 2 is a face on which the circuit or the like of the semiconductor device is formed, which has a street in a planar view.

The surface protective tape 3 is composed of the temporary-adhesive layer 3b provided on the substrate film 3a, and has a function to protect the semiconductor device formed on the patterned face 2. Specifically, at the wafer-thinning step which is a post-step, the patterned face 2 is supported by the semiconductor wafer 1, and at the same time the backing face of the wafer is ground. Therefore, the semiconductor wafer 1 needs to withstand a load in grinding. For this reason, the surface protective tape 3 is different from a mere resist film or the like, and has: the thickness enough to coat the device formed on the patterned face 2; and the pressing resistance which is low, and has: a high adhesiveness that can adhere tightly to the device, so that the infiltration of dusts, grinding water, and the like, in grinding, is not caused.

Out of the surface protective tape 3, the substrate film 3a is composed of a plastic, a gum, or the like, and examples of its materials include: a homopolymer or copolymer of α-olefin, such as polyethylene, polypropylene, ethylene/propylene copolymer, polybutene-1, poly-4-methylpentene-1, ethylene/vinyl acetate copolymer, ethylene/acrylic acid copolymer, and ionomers, or a mixture thereof; an elemental substance or a mixture of 2 or more kinds, such as polyethylene terephthalate, polyethylene naphthalate, polyphenylene sulfide, polyether imide, polyimide, polycarbonate, polymethyl methacrylate, polyurethane, and stylene/ethylene/butene- or pentene-based copolymer; and a resin composition in which another polymer, a filler, an additive or the like is blended with any of the foregoing polymers. These can be arbitrarily selected depending on the required characteristics. A laminate of a low-density polyethylene and an ethylene/vinyl acetate copolymer, a laminate of a polypropylene and a polyethylene terephthalate, a polyethylene terephthalate, or a polyethylene naphthalate is one of preferable materials.

The foregoing substrate film 3a can be produced using a general extrusion method. In the case where the substrate film 3a is obtained by laminating various resins, these are produced by a co-extrusion method or a lamination method. At this time, as conventionally practiced in the ordinary production method of the laminate film, an adhesion layer may be provided between resins. A thickness of the substrate film 3a is preferably from 20 to 200 μm and more preferably from 25 to 150 µm, from the viewpoint of strength/elongation property and radiation permeation property. In particular, the thickness of 25 µm is one of preferable embodiments.

The temporary-adhesive layer 3b should not damage a semiconductor device and the like at the time of temporary-adhesion to the patterned face 2, and should not break the semiconductor device and the like nor cause any temporary-adhesive residue on the surface at the time of removal, and moreover needs to have resistance to plasma, which is capable of functioning as a mask at the time of plasma dicing.

For this reason, in the temporary-adhesive layer 3b, it is possible to use: a non-curable temporary-adhesive having the foregoing properties; and a radiation polymerization-type temporary-adhesive, such as an ultraviolet curable temporary-adhesive, and an ionizing radiation curable temporary-adhesive, which is like an electron beam curable temporary-adhesive, in which the temporary-adhesive is three-dimensionally reticulated with preferably due to radiation curable temporary-adhesive and more preferably due to ultraviolet curable temporary-adhesive, thereby that adhesion force is lowered, and in addition, that a residue, such as a temporary-adhesive, hardly occurs on a surface after peeling-off the temporary-adhesive layer.

Note that, the radiation is a concept: including a light beam, such as ultraviolet; and an ionizing radiation, such as an electron beam.

Examples of the forgoing temporary-adhesive include: an acrylic temporary-adhesive; and a temporary-adhesive which is composed of this acrylic temporary-adhesive and a radiation polymerizable compound as a main component.

The temporary-adhesive contains a (meth)acrylic copolymer and a curing agent as components. Examples of the (meth)acrylic copolymer include: a copolymer of a polymer composed of a (meth)acrylic acid ester as a polymer-constituting unit component, and a (meth)acrylic polymer which constitutes a (meth)acrylic acid ester-based copolymer, or a copolymer of a functional monomer, such as a (meth)acrylic acid, a hydroxy-substituted alkyl ester of the (meth)acrylic acid, or the like; and a mixture of these polymers. As for the mass-average molecular weight of these polymers, those having a molecular weight as high as a range of about 500,000 to about 1,000,000 are generally applied to.

The curing agent is used for adjusting an adhesion force and a cohesion force, by conducting reaction of it with a functional group (for example, hydroxy, carboxy, epoxy groups, or the like) of the (meth)acrylic copolymer. Examples of the curing agent include: an epoxy compound having 2 or more epoxy groups in the molecule, such as 1,3-bis(N,N-diglycidyl aminomethyl)cyclohexane, 1,3-bis(N,N-diglycidyl aminomethyl)toluene, 1,3-bis(N,N-diglycidyl aminomethyl)benzene, or N,N,N',N'-tetraglycidyl-m-xylenediamine; an isocyanate-based compound having 2 or more isocyanate groups in the molecule, such as 2,4-tolylenediisocyanate, 2,6-tolylenediisocyanate, 1,3-xylylenediisocyanate, 1,4-xylylenediisocyanate, or diphenylmethane-4,4'-diisocyanate; an aziridine-based compound having 2 or more aziridinyl groups in the molecule, such as tetramethylol-tri-β-aziridinyl propionate, trimethylol-tri-β-aziridinyl propionate, trimethylolpropane-tri-β-aziridinyl propionate, or trimethylolpropane-tri-β-(2-methylaziridine) propionate; and the like. An addition amount of the curing agent may be adjusted depending on a desired adhesion force, and is suitably from 0.1 to 5.0 mass parts with respect to 100 mass parts of the (meth)acrylic copolymer.

Further, the radiation-curable temporary-adhesive is called as a radiation curable-type temporary-adhesive, while the radiation non-curable temporary-adhesive is called as a pressure-sensitive temporary-adhesive.

Generally, the radiation curable-type temporary-adhesive is composed of the acrylic temporary-adhesive and a radiation-polymerizable compound as main components. As for the radiation-polymerizable compound, use may be widely made of a low-molecular weight compound having, in the molecule, at least two or more photopolymerizable carbon-carbon double bonds which can be three-dimensionally reticulated by, for example, ultraviolet irradiation. Specifically, use may be widely applicable of: trimethylolpropane triacrylate, tetramethylolmethane tetraacrylate, pentaerythritol triacrylate, pentaerythritol tetraacrylate, dipentaerythritol mono-hydroxypentaacrylate, dipentaerythritol hexaacrylate, 1,4-butyleneglycol diacrylate, 1,6-hexanediol diacrylate, polyethyleneglycol diacrylate, oligo-ester acrylates, and the like.

Further, in addition to the forgoing acrylate-based compounds, use can be also made of: a urethane acrylate-based oligomer. The urethane acrylate-based oligomer is obtained by conducting reaction of an acrylate or methacrylate having a hydroxy group (for example, 2-hydroxyethyl acrylate, 2-hydroxyethyl methacrylate, 2-hydroxypropyl acrylate, 2-hydroxypropyl methacrylate, polyethyleneglycol acrylate, polyethyleneglycol methacrylate, and the like) with a urethane prepolymer having an isocyanate group at the end thereof, which is obtained by conducting reaction of a polyol compound, such as a polyester type- or a polyether type-polyol, and a polyvalent isocyanate compound (for example, 2,4-tolylene diisocyanate, 2,6-tolylene diisocyanate, 1,3-xylylene diisocyanate, 1,4-xylylene diisocyanate, methylene diphenyl-4,4'-diisocyanate, and the like).

As a blending ratio of the acrylic temporary-adhesive and the radiation-polymerizable compound in the radiation curable-type temporary-adhesive, the radiation-polymerizable compound is desirably blended in the range of 50 to 200 mass parts and preferably 50 to 150 mass parts with respect to 100 mass parts of the temporary-adhesive. If the blending ratio is in this range, the adhesion force of the temporary-adhesive layer after radiation irradiation is sharply declined.

Further, as the radiation curable-type temporary-adhesive, it is also possible to change the acrylic temporary-adhesive itself to the radiation-polymerizable acrylic acid ester copolymer, in place of blending the radiation-polymerizable compound with the acrylic temporary-adhesive, as mentioned above.

The radiation-polymerizable acrylic acid ester copolymer is a copolymer having, in the molecule of the copolymer, a reactive group which is capable of realizing a polymerization reaction upon exposure to a radiation, particularly to an ultraviolet ray. As the forgoing reactive group, an ethylenically unsaturated group, in other words, a group having a carbon-carbon double bond, is preferred. Examples thereof include: a vinyl group, an allyl group, a styryl group, a (meth)acryloyloxy group, a (meth)acryloylamino group, and the like.

This reactive group can be obtained, for example, by conducting reaction of a copolymer having a hydroxy group at the side chain of the copolymerized polymer, with a compound having a reactive group with the hydroxy group, for example, an isocyanate group or the like, and also having the reactive group which is capable of realizing a polymerization reaction upon exposure to an ultraviolet ray [representatively 2-(meth)acryloyloxyethyl isocyanate].

Further, in the case of conducting polymerization of a temporary-adhesive layer by radiation, a temporary-adhesive can be used in combination with a photopolymerization initiator, for example, isopropylbenzoin ether, isobutylbenzoin ether, benzophenone, Michler's ketone, chlorothioxanthone, benzyl methyl ketal, α-hydroxycyclohexyl phenyl ketone, 2-hydroxymethylpheny propane, and the like. By adding at least one of these compounds to the temporary-adhesive layer, a polymerization reaction can be efficiently accelerated.

A temporary-adhesive, in which a (meth)acrylate compound having an ultraviolet-curable carbon-carbon double bond is contained in an acrylic temporary-adhesive composed of a copolymer of 2-ethylhexyl acrylate and n-butyl acrylate; and, a photo-initiator and a photosensitizer, and in addition, any of known tackifier, softener, antioxidant, and like, are blended therewith, which is one of the preferable embodiments.

As to the radiation-curable temporary-adhesive or the temporary-adhesive layer composed of the radiation-curable temporary-adhesive, those described at paragraphs [0036] to [0055] of JP-A-2014-192204 are preferable.

The thickness of the temporary-adhesive layer 3b is preferably from 5 to 100 µm, and more preferably from 5 to 30 µm. Note that, if the thickness is less than 5 µm, there is a possibility that protection of the device or the like formed on the patterned face 2 would become insufficient. Further, in the case where the temporary-adhesive layer does not have enough adhesion to the irregularity of the patterned face, damage to the device occurs resulting from intrusion of the $SF_6$ gas. On the other hand, if the thickness thereof exceeds 100 µm, ashing treatment with $O_2$ plasma becomes difficult. Note that, the irregularity of the patterned face, although it depends on the kind of the device, is roughly from about a few micro meters to about 15 µm, and 5 to 30 µm is more preferable.

In the temporary-adhesive layer 3b, an anchor layer can be incorporated and provided on the side of the substrate film 3a, in addition to the temporary-adhesive composed of the materials. The anchor layer is ordinarily composed of an acrylic temporary-adhesive containing both a (meth)acrylic copolymer and a curing agent as essential components, and a pressure sensitive temporary-adhesive is used together.

It is preferable not to perform any corona treatment, which is an adhesion-improving treatment, any easy adhesion primer coating, or the like, between the layers of the substrate film 3a and the temporary-adhesive layer 3b, in order that only the substrate film 3a may be easily peeled off.

Further, from the similar purport, it is preferable to laminate a temporary-adhesive layer 3b on a smooth surface of the substrate film 3a, whereas it is preferable not to laminate the temporary-adhesive layer 3b on an irregularity surface (embossed surface) of the substrate film 3a. This is because if the temporary-adhesive layer 3b is laminated on the irregularity surface, an adhesion property of the temporary-adhesive layer 3b to the substrate film 3a is enhanced. Further, as the substrate film 3a, it is also preferable to use a separator which makes it easy to peel off from the temporary-adhesive layer 3b.

The wafer-fixing tape 4 is required to hold the semiconductor wafer 1 and to have resistance to plasma which is sustainable even if the wafer-fixing tape is subjected to the plasma dicing step. Further, in the picking-up step, a good picking-up property and also an expansion property in some cases are required. As the foregoing wafer-fixing tape 4, a tape similar to the surface protective tape 3 may be used. Further, use may be made of: any of known dicing tapes used in a conventional plasma dicing method, which are generally called as a dicing tape. Further, the use can be also made of: a die-bonding tape, in which an adhesion bond for die-bonding is laminated between the temporary-adhesive layer and the substrate film, in order to make it easy to transit to the die-bonding step after picking-up.

For the laser irradiation with which the temporary-adhesive layer 3b is cut, use can be made of: a laser irradiator for irradiating an ultraviolet or infrared laser light. In this laser irradiator, a laser irradiation part is arranged so as to be movable along the street of the semiconductor wafer 1. A laser can be irradiated, which is provided with an output controlled suitably to remove a temporary-adhesive layer 3b. If $CO_2$ laser is used as a laser light, it is possible to obtain a large power of several to tens of watts. Among the lasers, $CO_2$ laser can be preferably used.

In order to carry out the plasma dicing and the plasma ashing, use can be made of: a plasma-etching apparatus. The plasma-etching apparatus is an apparatus, which is capable of subjecting the semiconductor wafer 1 to dry etching, and in which a sealed treatment space is made in a vacuum chamber, to place the semiconductor wafer 1 on the side of the electrode for a high-frequency wave. A gas for plasma generation is supplied from the side of a gas-supplying electrode provided facing the electrode for high-frequency wave. If a high-frequency voltage is applied to the electrode for a high-frequency wave, plasma is generated between the gas-supplying electrode and the electrode for a high-frequency wave. Therefore, the resultant plasma is used. By circulating a refrigerant in a heat-producing electrode for high-frequency wave, it is possible to prevent a temperature elevation of the semiconductor wafer 1 due to the heat of this plasma.

In accordance with the method of processing the semiconductor wafer, any photolithographic process or the like becomes unnecessary, which is provided with a resist to be used in the conventional plasma dicing step, by giving a mask function in the plasma dicing to the surface protective tape of protecting the patterned face. In particular, by using the surface protective tape, a technique becomes unnecessary, in which a high level of alignment, such as printing and transferring, is required for the mask formation. The surface protective tape can be easily laminated on the semiconductor wafer surface, and a mask can be easily formed by the laser equipment.

Further, the temporary-adhesive layer 3b can be removed with $CO_2$ laser, and therefore removal of the mask portion can be carried out by the same apparatus as the plasma dicing apparatus. In addition, the plasma dicing is carried out from the patterned face 2 side (surface S side), and therefore it is not necessary to turn the chip upside down before the picking-up operation. From these reasons, the facilities can be simplified, and process costs can be considerably suppressed.

Figure 6A:
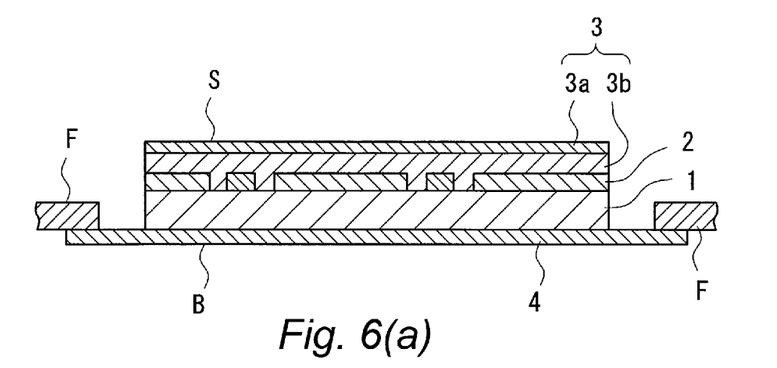
FIG. 6(a) shows a state in which both sides of the front and the back of the semiconductor wafer are covered and fixed with the surface protective tape and the wafer-fixing tape, respectively. Fragmentary
Figure 6B:
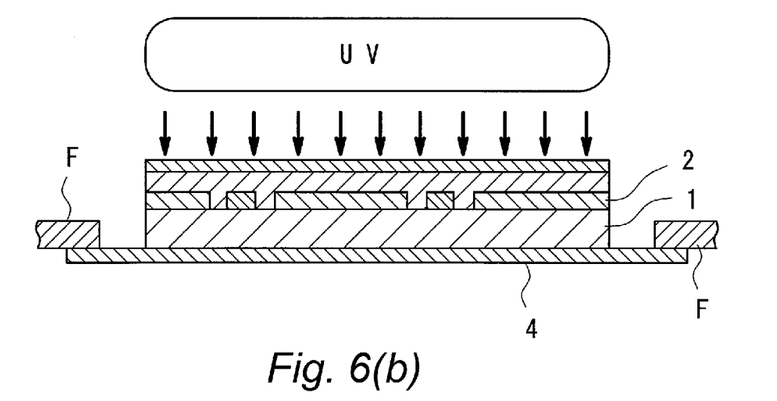
FIG. 6(b) shows how an ultraviolet light is irradiated. Fragmentary
Figure 6C:
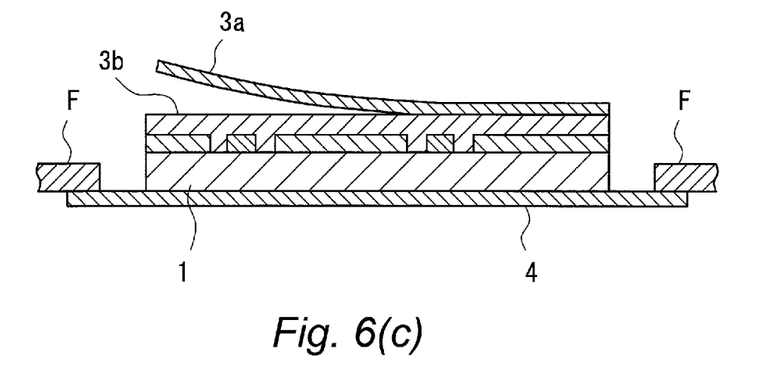
FIG. 6(c) shows how the substrate film is peeled off from the surface protective tape.

<Second Embodiment [FIGS. 6(a) to 6(c)]>

This embodiment is different from the first embodiment in the point that this embodiment contains a step of curing the temporary-adhesive layer by irradiating the surface protective tape 3 with a radiation, such as an ultraviolet light or the like, prior to the step of peeling-off the substrate film 3a in the first embodiment. Other steps are the same as in the first embodiment.

Specifically, the surface protective tape 3 is laminated on the surface S side of the semiconductor wafer 1, and the wafer-fixing tape 4 is laminated on the ground backing-face B side of the semiconductor wafer 1, followed by supporting and fixing to a ring flame F (see FIG. 2(c), FIG. 6(a)). Then, an ultraviolet light UV is irradiated from the surface S side toward the surface protective tape 3 (see FIG. 6(b)). Then, after curing the temporary-adhesive layer 3b of the surface protective tape 3, the substrate film 3a is removed (see FIG. 6(c)), whereby the temporary-adhesive layer 3b is uncovered. Then, this step is transited to a step of cutting, with a laser L, a portion of the temporary-adhesive layer 3b corresponding to the street.

In the surface protective tape that can be used in this embodiment, at variation with the surface protective tape 3 described in the first embodiment, a material which is capable of being cured with a radiation, such as an ultraviolet ray or the like, is used in the temporary-adhesive layer 3b.

By curing the temporary-adhesive layer 3b with the ultraviolet light or the like, peeling-off of the substrate film 3 is made easy, and plasma resistance at the time of the plasma dicing can be improved.

Figure 7A:
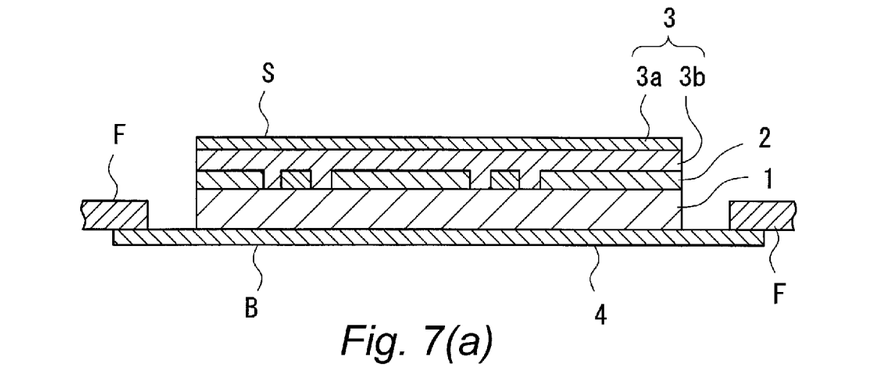
FIG. 7(a) shows a state in which both sides of the front and the back of the semiconductor wafer are covered and fixed with the surface protective tape and the wafer-fixing tape, respectively. Fragmentary
Figure 7B:
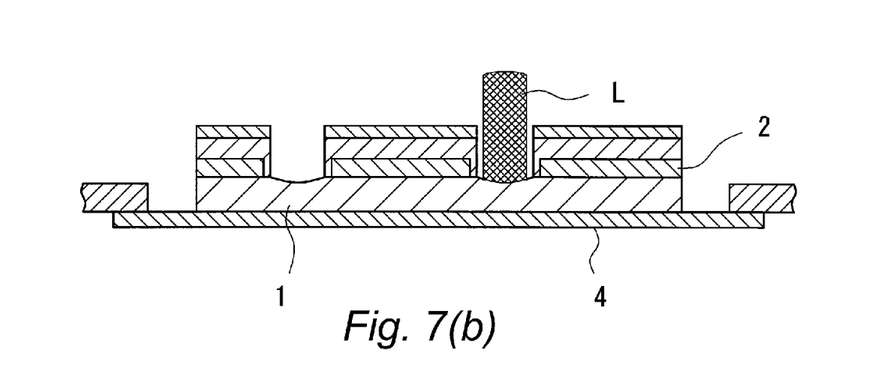
FIG. 7(b) shows a step of cutting off the temporary-adhesive layer corresponding to the street portion with a laser. Fragmentary
Figure 7C:
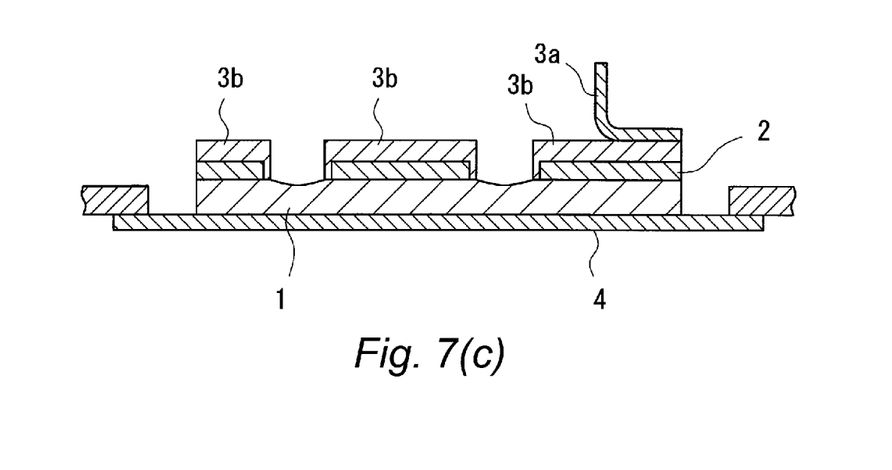
FIG. 7(c) shows how the substrate film is peeled off from the surface protective tape.

<Third Embodiment [FIGS. 7(a) to 7(c)]>

In the first embodiment, after peeling-off the substrate film 3a of the surface protective tape 3, the temporary-adhesive layer 3b is cut with the $CO_2$ laser, thereby to form an opening at the street portion. However, this embodiment is different from the first embodiment in the point that in this embodiment, keeping the substrate film 3a on the temporary-adhesive layer 3b, both layers of the substrate film 3a and the temporary-adhesive layer 3b are cut with the $CO_2$ laser, thereby to form the opening at the street portion.

In other words, this embodiment is performed, by the step of cutting, with the $CO_2$ laser, a portion of the surface protective tape 3 corresponding to the street of the semiconductor wafer, to form the opening at the street of the semiconductor wafer, and the step of peeling-off its substrate film 3a from the surface protective tape 3, to expose the temporary-adhesive layer 3b of the surface protective tape 3; in place of the step of peeling-off its substrate film 3a from the surface protective tape 3 in the first embodiment, thereby to expose the temporary-adhesive layer 3b of the surface protective tape 3, and the step of cutting, with the $CO_2$ laser, a portion of the exposed temporary-adhesive layer 3b corresponding to the street of the semiconductor wafer, thereby to form the opening at the street.

Specifically, the surface protective tape 3 is laminated on the surface S side of the semiconductor wafer 1, and the wafer-fixing tape 4 is laminated on the ground backing-face B side of the semiconductor wafer 1, followed by supporting and fixing to a ring flame F (see FIG. 2(c), FIG. 7(a)). Then, the $CO_2$ laser L is irradiated from the surface S side toward a plurality of streets appropriately formed in a grid pattern (not shown), thereby for removing the surface protective tape 3, to form the opening at the street portion (see FIG. 7(b)). Then, by removing the remaining substrate film 3a of the mask portion, the temporary-adhesive layer 3b is uncovered (see FIG. 7(c)). Then, this step is transited to the plasma dicing step.

As to the removal of the remaining substrate film 3a of the mask portion, the substrate film 3a can be simply and preferably removed, by adopting a method of: laminating a separately prepared temporary-adhesive tape on the substrate film 3a to be removed; and removing the substrate film 3a together with the temporary-adhesive tape.

In this embodiment, the surface protective tape 3 is cut with the laser together with the substrate film 3a, and therefore this allows simplification of a step of peeling-off the substrate film portion in advance.

<Fourth Embodiment [FIG. 8(a) to 8(d)]>

This embodiment is different from the third embodiment in the point that this embodiment contains a step of curing the temporary-adhesive layer 3b by irradiating the surface protective tape 3 with a radiation, such as an ultraviolet light or the like, prior to the step of peeling-off the substrate film 3a in the third embodiment. Other steps are the same as in the third embodiment.

Figure 8A:
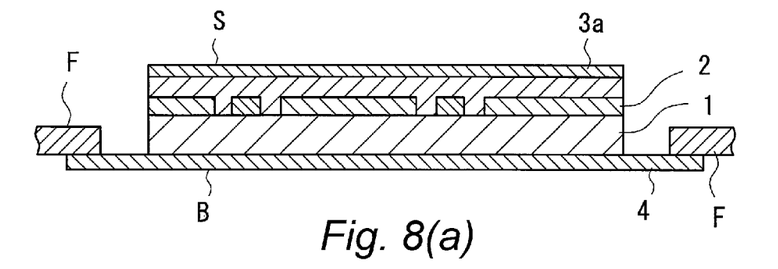
FIG. 8(a) shows a state in which both sides of the front and the back of the semiconductor wafer are covered and fixed with the surface protective tape and the wafer-fixing tape, respectively. Fragmentary
Figure 8B:
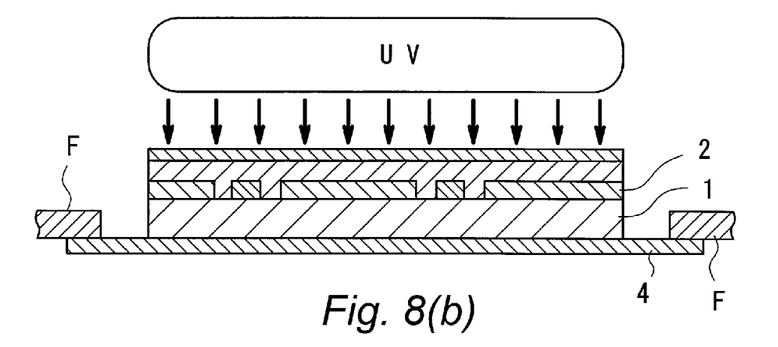
FIG. 8(b) shows how an ultraviolet light is irradiated. Fragmentary
Figure 8C:
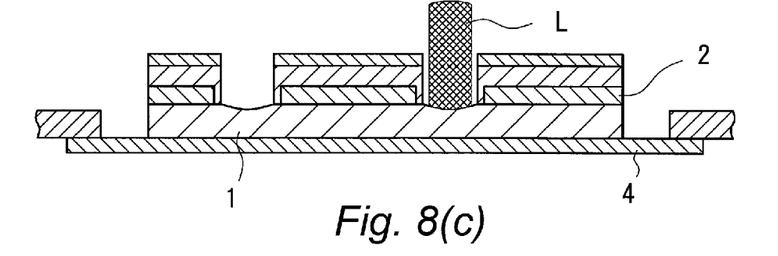
FIG. 8(c) shows a step of cutting off the surface protective tape corresponding to the street portion with a laser. Fragmentary
Figure 8D:
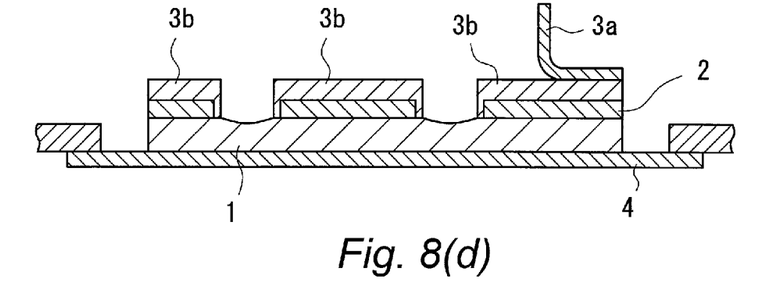
FIG. 8(d) shows how to peel off the substrate film.

Specifically, the surface protective tape 3 is laminated on the surface S side of the semiconductor wafer 1, and the wafer-fixing tape 4 is laminated on the ground backing-face B side of the semiconductor wafer 1, followed by supporting and fixing to a ring flame F (see FIG. 2(c), FIG. 8(a)). Then, an ultraviolet light UV is irradiated from the surface S side toward the surface protective tape 3 (see FIG. 8(b)). Then, after curing the temporary-adhesive layer 3b of the surface protective tape 3, the $CO_2$ laser L is irradiated from the surface S side toward a plurality of streets appropriately formed in a grid pattern (not shown)), thereby for removing the surface protective tape 3, to form the opening at the street portion (see FIG. 8(c)). Then, by removing the remaining substrate film 3a of the mask portion, the temporary-adhesive layer 3b is uncovered (see FIG. 8(d)). Then, this step is transited to the plasma dicing step.

In the surface protective tape 3 that can be used in this embodiment, at variation with the surface protective tape 3 described in the first embodiment, a material which is capable of being cured with a radiation, such as an ultraviolet ray or the like, is used in the temporary-adhesive layer 3b.

By curing the temporary-adhesive layer 3b with the ultraviolet light or the like, peeling-off of the substrate film 3a is made easy, and plasma resistance at the time of the plasma dicing can be improved.

As a modified example of this embodiment, a step of forming an opening at the street portion with a laser can be carried out prior to the step of irradiating an ultraviolet light. Even in this way, the temporary-adhesive layer 3b of the mask portion can be cured.

The above embodiments are only examples of the present invention. Therefore, the present invention is not limited to any of these embodiments, and any of addition, deletion, or modification of the process known in each process may be carried out to the extent of being consistent with the spirit of the present invention.

EXAMPLES

The present invention will be described in more detail based on examples given below, but the invention is not meant to be limited by these.

Example 1

After preparing surface protective tapes of Samples 1 to 8 having the compositions shown in Table 1, the processing consisting of the steps shown below was carried out using each of the surface protective tapes.

First, the surface protective tape was laminated on the patterned face side of the silicon wafer with a diameter of 8 inches so as to have roughly the same diameter as the wafer, and then the wafer was ground with a back grinder [DFD8540 (manufactured by DISCO Inc.)] until the wafer thickness would reach 50 μm. Then, an UV-curable dicing tape [UC-353EP-110 (manufactured by Furukawa Electric Co., Ltd.)] was laminated on the ground wafer backing-face side, followed by supporting and fixing to the ring flame. Then, the substrate film was peeled-off from the surface protective tape, and by irradiating with the $CO_2$ laser along the street portion of the silicon wafer from the top of the uncovered temporary-adhesive layer, the temporary-adhesive layer was removed, to form an opening at the street portion.

After that, plasma dicing was carried out, by plasma irradiating with $SF_6$ gas as a plasma generating gas, at the etching speed of 0.5 μm/min, from the surface side of the uncovered temporary-adhesive layer, so that the wafer was cut, followed by dividing into individual chips. Then, ashing was carried out, with $O_2$ gas as a plasma generating gas, at the etching speed of 1.0 μm/min, thereby to remove the temporary-adhesive layer. After that, an ultraviolet light was irradiated from the dicing tape side, thereby to lower an adhesion force of the dicing tape, followed by the picking-up step, chips were picked up.

TABLE 1

| Sample No. | Substrate film | | Temporary-adhesive layer | |
|---|---|---|---|---|
| | Material | Thickness | Material | Thickness |
| Sample 1 | LDPE/EVA lamination | 110 μm | 1 layer: Reactive P | 20 μm |
| Sample 2 | PP/PET lamination | 95 μm | 2 layers: Anchor layer/temporary-adhesive layer Anchor layer: Pressure-sensitive temporary-adhesive Temporary-adhesive layer: Reactive P | 30 μm |
| Sample 3 | PET | 25 μm | 2 layers: Anchor layer/temporary-adhesive layer Anchor layer: Pressure-sensitive temporary-adhesive Temporary-adhesive layer: Reactive P | 15 μm |
| Sample 4 | PEN | 25 μm | 2 layers: Anchor layer/temporary-adhesive layer Anchor layer: Pressure-sensitive temporary-adhesive Temporary-adhesive layer: Reactive P | 15 μm |
| Sample 5 | PET | 25 μm | 1 layer: Temporary-adhesive layer A | 5 μm |
| Sample 6 | PET (separator) | 25 μm | 1 layer: Temporary-adhesive layer A | 5 μm |
| Sample 7 | PET (separator) | 25 μm | 1 layer: Temporary-adhesive layer A | 10 μm |
| Sample 8 | PET (separator) | 25 μm | 1 layer: Temporary-adhesive layer A | 15 μm |

Herein, the separator in Table 1 is E7006 manufactured by Toyobo Co., Ltd. The reactivity P represents an ultraviolet light-curable temporary-adhesive consisting primarily of an acrylic temporary-adhesive having a carbon-carbon double bond in the polymer molecule. The temporary-adhesive layer A represents a layer of an ultraviolet light-curable temporary-adhesive consisting primarily of an acrylic temporary-adhesive and a radiation-polymerizable compound. Further, the pressure-sensitive temporary-adhesive of the anchor layer is a pressure-sensitive temporary-adhesive consisting primarily of an acrylic copolymer and a curing agent.

According to checking of the resultant chips after picking-up, chipping was not observed in Examples of experiments conducted by using any of the surface protective tapes of Samples 1 to 8. Further, the chips were able to be successfully picked up.

Example 2

Using the surface protective tapes of Samples 1 to 8 having the compositions shown in Table 1, a processing in which a part of the processing in Example 1 was changed as follows, was carried out.

Specifically, a processing was carried out, in which conducting was made of: curing the temporary-adhesive layer by irradiating the ultraviolet light prior to peeling-off of the substrate film. The other processing was the same as in Example 1.

According to checking of the resultant chips after picking-up, chipping was not observed in Examples of experiments conducted by using any of the surface protective tapes of Samples 1 to 8. Further, the chips were able to be successfully picked up.

Example 3

Using the surface protective tapes of Samples 1 to 8 having the compositions shown in Table 1, a processing in which a part of the processing in Example 1 was changed as follows, was carried out.

Specifically, both the substrate film and the temporary-adhesive layer were removed with the $CO_2$ laser, prior to peeling-off of the substrate film, thereby to form an opening at the street portion. Then, the remaining substrate film was removed, and then the plasma dicing processing was carried out. The other processing was carried out in the same manner as in Example 1.

According to checking of the resultant chips after picking-up, chipping was not observed in Examples of experiments conducted by using any of the surface protective tapes of Samples 1 to 8. Further, the chips were able to be successfully picked up.

Example 4

Using the surface protective tapes of Samples 1 to 8 having the compositions shown in Table 1, a processing in which a part of the processing in Example 3 was changed as follows, was carried out.

Specifically, prior to the irradiation of the $CO_2$ laser, the temporary-adhesive layer was subjected to the curing treatment with the ultraviolet light irradiation. The other processing was carried out in the same manner as in Example 3.

According to checking of the resultant chips after picking-up, chipping was not observed in Examples of experiments conducted by using any of the surface protective tapes of Samples 1 to 8. Further, the chips were able to be successfully picked up.

As is apparent from Examples 1 to 4, any photolithographic process became unnecessary, and those allowed simplification of the production facilities, suppression of the process costs, and also reduction of the chipping at the chip-cutting plane.

Having described our invention as related to the present embodiments, it is our intention that the invention not be limited by any of the details of the description, unless otherwise specified, but rather be construed broadly within its spirit and scope as set out in the accompanying claims.

This application claims priority on Patent Application No. 2015-051482 filed in Japan on Mar. 13, 2015, which is entirely herein incorporated by reference.

REFERENCE SIGNS LIST 1 semiconductor wafer
2 patterned face
3 surface protective tape
   3a substrate film
   3b temporary-adhesive layer
4 wafer-fixing tape
   4a temporary-adhesive layer or adhesive layer
   4a substrate film
7 chip
S surface
B backing face
M1 wafer-grinding apparatus
M2 pin
M3 collet
F ring frame
L $CO_2$ laser
P1 plasma of $SF_6$ gas
P2 plasma of $O_2$ gas

The invention claimed is:

1. A method of processing a semiconductor wafer, comprising steps (a) to (d):
   (a) a step of grinding a backing-face side of the semiconductor wafer at a state wherein a surface protective tape comprising a temporary-adhesive layer on a substrate film is laminated on a patterned-face side of the semiconductor wafer; and then laminating a wafer-fixing tape on the ground backing-face side, followed by supporting and fixing to a ring flame;
   (b) a step of forming an opening at a street from the patterned-face side of the semiconductor wafer, including $CO_2$ laser cutting of a portion corresponding to the street of the semiconductor wafer, and peeling-off of the substrate film;
   (c) a plasma-dicing step of segmentalizing the semiconductor wafer at the street with $SF_6$ plasma, using the temporary-adhesive layer as a mask, and thereby singulating the semiconductor wafer into semiconductor chips; and
   (d) an ashing step of removing the temporary-adhesive layer with $O_2$ plasma,
wherein said method of processing a semiconductor wafer does not include any photolithographic steps.

2. The method of processing the semiconductor wafer according to claim 1, wherein the step (b) comprises:
   (i) a step of exposing the temporary-adhesive layer by peeling-off the substrate film from the surface protective tape laminated on the patterned face of the semiconductor wafer; and
   (ii) a step of forming an opening at the street of the semiconductor wafer by $CO_2$ laser cutting of the portion corresponding to the street of the semiconductor wafer out of said exposed temporary-adhesive layer.

3. The method of processing the semiconductor wafer according to claim 1, wherein the step (b) comprises:
   (iii) a step of forming an opening at the street of the semiconductor wafer by $CO_2$ laser cutting of the portion corresponding to the street of the semiconductor wafer out of the surface protective tape laminated on the patterned face of the semiconductor wafer; and
   (iv) a step of exposing the temporary-adhesive layer by peeling-off the substrate film from said surface protective tape.

4. The method of processing the semiconductor wafer according to claim 1, further comprising:
   a step of curing the temporary-adhesive layer by irradiating an ultraviolet light prior to peeling-off the substrate film.

5. The method of processing the semiconductor wafer according to claim 1, wherein the wafer-fixing tape in the step (a) is a dicing tape or a dicing die-bonding tape.

6. The method of processing the semiconductor wafer according to claim 1, further comprising:
   a step of picking up the chips from the wafer-fixing tape, after the step (d).

7. The method of processing the semiconductor wafer according to claim 6, further comprising:
   a step of transiting the thus-obtained picked-up chips to a die-bonding step.

8. A semiconductor chip produced by the method of processing the semiconductor wafer according to claim 1.

9. A surface protective tape which is utilized in the method of processing the semiconductor wafer according to claim 1.

* * * * *